United States Patent
Sohn et al.

(10) Patent No.: US 7,772,637 B2
(45) Date of Patent: Aug. 10, 2010

(54) SEMICONDUCTOR DEVICES INCLUDING GATE STRUCTURES AND LEAKAGE BARRIER OXIDES

(75) Inventors: Woong-Hee Sohn, Seoul (KR); Chang-Won Lee, Gyeonggi-do (KR); Sun-Pil Youn, Seoul (KR); Gil-Heyun Choi, Gyeonggi-do (KR); Byung-Hak Lee, Gyeonggi-do (KR); Jong-Ryeol Yoo, Gyeonggi-do (KR); Hee-Sook Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/401,087

(22) Filed: Mar. 10, 2009

(65) Prior Publication Data

US 2009/0173986 A1  Jul. 9, 2009

Related U.S. Application Data

(62) Division of application No. 11/221,062, filed on Sep. 7, 2005, now Pat. No. 7,521,316.

(30) Foreign Application Priority Data

| Sep. 9, 2004 | (KR) | ................................ 2004-72347 |
| Sep. 21, 2004 | (KR) | ................................ 2004-75656 |
| Dec. 6, 2004 | (KR) | ................................ 2004-10200 |

(51) Int. Cl.
    *H01L 21/00* (2006.01)
(52) U.S. Cl. ............... 257/316; 257/E21.206; 257/E21.268; 257/E21.279; 257/E21.552; 257/E21.688; 257/E27.081
(58) Field of Classification Search ......... 257/316–323, 257/E21.206–E21.209, 268–293, 507, E21.552, 257/E21.688, E21.081
    See application file for complete search history.

(56) References Cited

U.S. PATENT DOCUMENTS 5,286,665 A  2/1994  Muragishi et al.

(Continued)

FOREIGN PATENT DOCUMENTS

| JP | 09-129876 | 5/1997 |
| JP | 10-335652 | 12/1998 |

(Continued)

OTHER PUBLICATIONS

English Translation of Office Action issued by Korean Intellectual Property Office for Korean Application No. 10-2004-0072347 on Apr. 6, 2006.
Office Action issued by Korean Intellectual Property Office for Korean Application No. 10-2004-0072347 on Apr. 6, 2006.

*Primary Examiner*—Michael S Lebentritt
(74) *Attorney, Agent, or Firm*—Myers Bigel Sibley & Sajovec, P.A.

(57) ABSTRACT

Methods of forming a semiconductor device may include forming a tunnel oxide layer on a semiconductor substrate, forming a gate structure on the tunnel oxide layer, forming a leakage barrier oxide, and forming an insulating spacer. More particularly, the tunnel oxide layer may be between the gate structure and the substrate, and the gate structure may include a first gate electrode on the tunnel oxide layer, an inter-gate dielectric on the first gate electrode, and a second gate electrode on the inter-gate dielectric with the inter-gate dielectric between the first and second gate electrodes. The leakage barrier oxide may be formed on sidewalls of the second gate electrode. The insulating spacer may be formed on the leakage barrier oxide with the leakage barrier oxide between the insulating spacer and the sidewalls of the second gate electrode. In addition, the insulating spacer and the leakage barrier oxide may include different materials. Related structures are also discussed.

15 Claims, 5 Drawing Sheets

U.S. PATENT DOCUMENTS

| | | | |
|---|---|---|---|
| 5,514,891 A | | 5/1996 | Abrokwah et al. |
| 5,612,249 A | * | 3/1997 | Sun et al. .................... 438/297 |
| 5,661,056 A | | 8/1997 | Takeuchi |
| 6,057,196 A | * | 5/2000 | Gau ........................... 438/279 |
| 6,337,246 B1 | | 1/2002 | Sobek et al. |
| 6,342,451 B1 | | 1/2002 | Ahn |
| 6,372,618 B2 | | 4/2002 | Forbes et al. |
| 6,630,392 B2 | | 10/2003 | Kim et al. |
| 6,703,282 B1 | | 3/2004 | Yang et al. |
| 6,716,570 B2 | | 4/2004 | Nagarajan et al. |
| 6,894,357 B2 | | 5/2005 | Guo |
| 7,115,471 B2 | | 10/2006 | Shinada et al. |
| 2004/0051135 A1 | * | 3/2004 | Dong et al. ................. 257/316 |
| 2005/0023597 A1 | | 2/2005 | Kutsukake et al. |
| 2005/0121715 A1 | | 6/2005 | Jeng |
| 2007/0259491 A1 | | 11/2007 | Nakagawa |

FOREIGN PATENT DOCUMENTS

| | | |
|---|---|---|
| JP | 11-145131 | 5/1999 |
| JP | 2002-231942 | 8/2002 |
| JP | 2003-338623 | 11/2003 |
| KR | 1998-067517 | 10/1998 |
| KR | 2000-0076658 | 12/2000 |
| KR | 2003-0049594 | 6/2003 |
| KR | 2004-0003922 | 1/2004 |
| KR | 1020040003922 | 1/2004 |

* cited by examiner

SEMICONDUCTOR DEVICES INCLUDING GATE STRUCTURES AND LEAKAGE BARRIER OXIDES

RELATED APPLICATION

This application claims the benefit of priority as a divisional of U.S. application Ser. No. 11/221,062 filed Sep. 7, 2005 now U.S. Pat. No. 7,521,316, which claims the benefit of priority to Korean Patent Application No. 2004-72347, filed Sep. 9, 2004; Korean Patent Application No. 2004-75656, filed Sep. 21, 2004; and Korean Patent Application No. 2004-102000 filed Dec. 6, 2004. The disclosures of each of the above referenced U.S. and Korean patent applications are hereby incorporated herein by reference in their entirety.

FIELD OF THE INVENTION

The present invention relates to semiconductor devices and, more particularly, to methods of forming gate structures for memory devices.

BACKGROUND

Flash memory devices are non-volatile memory devices which allow information to be electrically erased or programmed. Flash memory devices are widely employed as memory devices for electronic devices such as computers, and digital cameras. A unit cell gate pattern of a flash memory device may include a floating gate used as a charge storage layer, and a control gate used to control input and output signals. The floating gate is separated from a semiconductor substrate by a tunnel oxide layer, and the floating gate and the control gate are separated from each other by an inter-gate dielectric layer. The inter-gate dielectric layer electrically isolates the floating gate from the control gate so that the floating gate may serve as a charge storage layer.

The floating gate and the control gate may be formed of polysilicon layers. The inter-gate dielectric layer may be an ONO layer (silicon oxide layer/silicon nitride layer/silicon oxide layer). As densities of flash memory devices increase, a reduced resistance gate pattern and an improved inter-gate dielectric layer to replace the ONO layer may be desired. For example a metal layer may be deposited on the polysilicon layer to provide a reduced resistance gate pattern for the control gate. A tungsten layer, a titanium layer, or a tantalum layer having a relatively low specific resistance and a relatively high melting point may be used for the metal layer. The ONO layer for the inter-gate dielectric layer may be replaced with a high-k dielectric layer.

A dry etching process, such as plasma etching or reactive ion etching (RIE), may be used to form the gate pattern of the semiconductor device. When a gate pattern is formed using a dry etching process, a corner of a gate oxide layer below the gate pattern may be damaged by etching. The etch damage may affect a dielectric breakdown voltage of the gate oxide layer below the gate pattern reducing reliability of the semiconductor device. Accordingly, to cure the etch damage of the gate oxide layer, an additional oxidation process (referred to as a reoxidation process) may be carried out after the gate pattern is formed. An example of the reoxidation process is disclosed in U.S. Pat. No. 6,372,618 the disclosure of which is hereby incorporated herein in its entirety by reference.

A reoxidation process may be carried out during the process of forming the gate pattern of the flash memory device to cure etch damage of the tunnel oxide layer. The reoxidation process may be performed at a relatively high temperature of about 850° C. (degrees C.) or more, and oxidants may penetrate through an interface between the inter-gate dielectric layer and the floating gate and an interface between the inter-gate dielectric layer and the control gate so that a bird's beak is formed at both sides of the inter-gate dielectric layer. When the thickness of the inter-gate dielectric layer increases due to the bird's beak, a dispersion of cell characteristics of the flash memory device may increase. When a high-k dielectric layer is used as the inter-gate dielectric layer as described above, the floating gate and the control gate may be contaminated by metal ions diffusing from the high-k dielectric layer during the reoxidation process.

To address these issues, a silicon nitride layer spacer may be formed covering sidewalls of the gate pattern, and then, the reoxidation process may be performed. A leakage current, however, may occur between the floating gate and the insulating gate along an interface between the gate pattern and the silicon nitride layer spacer.

SUMMARY

According to some embodiments of the present invention, a method of forming a semiconductor device may include forming a tunnel oxide layer on a semiconductor substrate, and forming a gate structure on the tunnel oxide layer such that the tunnel oxide layer is between the gate structure and the substrate. More particularly, the gate structure may include a first gate electrode on the tunnel oxide layer, an inter-gate dielectric on the first gate electrode, and a second gate electrode on the inter-gate dielectric with the inter-gate dielectric between the first and second gate electrodes. In addition, a leakage barrier oxide may be formed on sidewalls of the second gate electrode, and an insulating spacer may be formed on the leakage barrier oxide with the leakage barrier oxide between the insulating spacer and the sidewalls of the second gate electrode. Moreover, the insulating spacer and the leakage barrier oxide layer may include different materials.

According to other embodiments of the present invention, a semiconductor device may include a semiconductor substrate, a tunnel oxide layer on the semiconductor substrate, and a gate structure on the tunnel oxide layer such that the tunnel oxide layer is between the gate structure and the substrate. More particularly, the gate structure may include a first gate electrode on the tunnel oxide layer, an inter-gate dielectric on the first gate electrode, and a second gate electrode on the inter-gate dielectric with the inter-gate dielectric between the first and second gate electrodes. A leakage barrier oxide may be provided on sidewalls of the second gate electrode, and an insulating spacer may be provided on the leakage barrier oxide with the leakage barrier oxide between the insulating spacer and the sidewalls of the second gate electrode. Moreover, the insulating spacer and the leakage barrier oxide may include different materials.

According to some embodiments of the present invention, a reliable gate pattern may be provided, an increase in thickness of an inter-gate dielectric layer due to the bird's beak phenomenon may be reduced, and/or leakage current between polysilicon gate electrodes may be reduced. According to some embodiments of the present invention a method of forming a gate pattern of a semiconductor device having a leakage barrier insulating layer may be provided.

According to some embodiments of the present invention, a gate structure may be formed having a first conductive layer pattern, an inter-gate dielectric layer pattern, and a second conductive layer pattern on a semiconductor substrate having a tunnel oxide layer thereon. A low temperature selective oxidation may be performed on a resultant structure including the gate structure to form a leakage barrier insulating layer covering sidewalls of the first and second conductive layer patterns. A spacer may be formed to cover sidewalls of the gate structure having the leakage barrier insulating layer.

The first and second conductive layer patterns may be formed of polysilicon layers. The gate structure may also include a metal layer pattern stacked on the second conductive layer pattern. More particularly, the metal layer pattern may be formed of a tungsten layer.

The inter-gate dielectric layer pattern may be formed of an ONO layer and/or a high-k dielectric layer. With a high-k dielectric layer, the high-k dielectric layer may be formed of a single layer or a stack layer including at least one layer selected from the group consisting of an Aluminum oxide (AlO) layer, a Hafnium oxide (HfO) layer, a Hafnium silicate (HfSiO) layer, a Hafnium Aluminum oxide (HfAlO) layer, and Tantalum oxide (TaO) layer.

The low temperature selective oxidation may be performed at a temperature in the range of about 100° C. (degrees C.) to about 800° C. (degrees C.). The low temperature selective oxidation may be a radical oxidation process using a hydrogen radical and/or an oxygen radical in a plasma. The leakage barrier insulating layer may be formed to a thickness in a range of about 5 Å (Angstroms) to about 100 Å (Angstroms).

Sidewalls of the first conductive layer pattern, the inter-gate dielectric layer pattern and the second conductive layer pattern may be selectively etched to reduce respective widths thereof before performing the low temperature selective oxidation. An additional oxidation process may also be performed after forming the spacer. More particularly, the additional oxidation process may be a radical oxidation process using plasma.

According to additional embodiments of the present invention, a first conductive layer line may be formed on a semiconductor substrate having a tunnel oxide layer thereon. An inter-gate dielectric layer and a second conductive layer may be formed on the semiconductor substrate having the first conductive layer line. The second conductive layer and the inter-gate dielectric layer may be patterned to expose the first conductive layer line, so that a preliminary gate structure is formed including an inter-gate dielectric layer pattern and a second conductive layer pattern and crossing the first conductive layer line. A low temperature selective oxidation may be performed on the preliminary gate structure to form a leakage barrier insulating layer covering an exposed region of the first conductive layer pattern and sidewalls of the second conductive layer pattern. A spacer may then be formed covering sidewalls of the preliminary gate structure. The first conductive layer line may be patterned to form a first conductive layer pattern aligned with respect to the spacer and the preliminary gate structure. An additional oxidation process may be performed on the structure including the first conductive layer pattern.

The first and second conductive layer patterns may be formed of polysilicon layers. In addition, a metal layer may be formed on the second conductive layer. More particularly, the metal layer may be formed of a tungsten layer, and may be patterned together with the second conductive layer and the inter-gate dielectric layer.

The inter-gate dielectric layer may be formed of an ONO layer and/or a high-k dielectric layer. With a high-k dielectric layer, the high-k dielectric layer may be formed of a single layer or a stack layer including at least one layer selected from the group consisting of an Aluminum oxide (AlO) layer, a Hafnium oxide (HfO) layer, a Hafnium silicate (HfSiO) layer, a Hafnium Aluminum oxide (HfAlO) layer, and/or a Tantalum oxide (TaO) layer.

The low temperature selective oxidation may be performed at a temperature in the range of about 100° C. (degrees C.) to about 800° C. (degrees C.). The low temperature selective oxidation may be a radical oxidation process using a hydrogen radical and/or an oxygen radical in a plasma. The leakage barrier insulating layer may be formed to a thickness in a range of about 5 Å (Angstroms) to about 100 Å (Angstroms).

Sidewalls of the second conductive layer pattern and the inter-gate dielectric layer pattern, and an exposed region of the first conductive layer line may be selectively etched to reduce a width of the preliminary gate structure before performing the low temperature selective oxidation. Moreover, an additional oxidation process, such as a radical oxidation process using plasma, may be performed.

DETAILED DESCRIPTION

Figure 1:
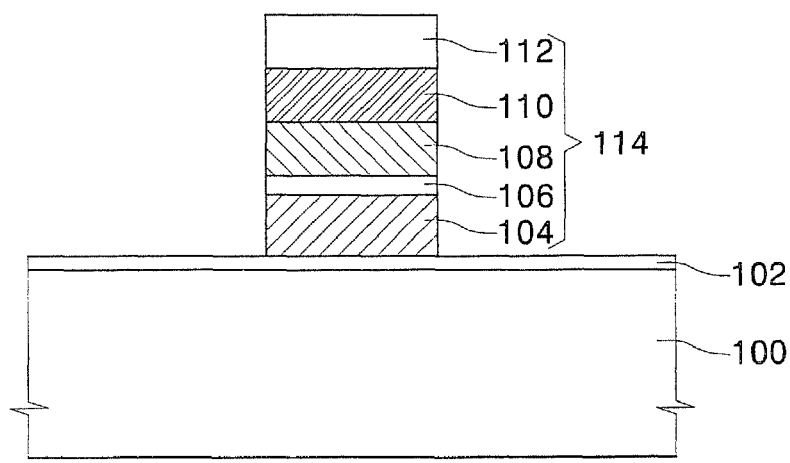
FIGS. 1 to 4 are cross-sectional views illustrating steps of forming gate patterns of flash memory devices according to first embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

In the drawings, thickness and/or widths of layers, regions, and/or lines are exaggerated for clarity. It will also be understood that when an element such as a layer, region or substrate is referred to as being on another element, it can be directly on the other element or intervening elements may also be present. In contrast, if an element such as a layer, region or substrate is referred to as being directly on another element, then no other intervening elements are present. As used herein, the term and/or includes any and all combinations of one or more of the associated listed items.

Furthermore, relative terms, such as beneath, over, under, upper, and/or lower may be used herein to describe one element's relationship to another element as illustrated in the figures. It will be understood that relative terms are intended to encompass different orientations of the device in addition to the orientation depicted in the figures. For example, if the device in one of the figures is turned over, elements described as below other elements would then be oriented above the other elements. The exemplary term below, can therefore, encompasses both an orientation of above and below.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section could be termed a first region, layer or section without departing from the teachings of the present invention. Like numbers refer to like elements throughout.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 4 are cross-sectional views illustrating steps of forming a gate pattern of a flash memory device according to first embodiments of the present invention. Referring to FIG. 1, a tunnel oxide layer 102 may be formed on a semiconductor substrate 100. The tunnel oxide layer 102 may be a thermal oxide layer formed by thermally oxidizing the surface of the substrate 100.

Alternatively, a silicon oxynitride layer or a high-k dielectric layer may be used instead of or in addition to tunnel oxide layer 102. The high-k dielectric layer may be formed using chemical vapor deposition (CVD) or atomic layer deposition (ALD). In this case, the high-k dielectric layer may be formed of an aluminum oxide (AlO) layer, a hafnium oxide (HfO) layer, a zirconium oxide (ZrO) layer, a lanthanum oxide (LaO) layer, a hafnium silicate (HfSiO) layer, a titanium oxide (TiO) layer, and/or a tantalum oxide (TaO) layer.

Although not shown in FIG. 1, an isolation layer may be formed in the semiconductor substrate 100 to define an active region, and the tunnel oxide layer 102 may be formed to cover the active region. A gate structure 114 may be formed on the semiconductor substrate having the tunnel oxide layer 102. The gate structure 114 may include a first conductive layer pattern 104 (a first gate electrode), an inter-gate dielectric layer pattern 106 (inter-gate dielectric) and a second conductive layer pattern 108 (a second gate electrode) which are sequentially stacked on the tunnel oxide layer 102. The gate structure 114 may also include a metal layer pattern 110 and a capping layer pattern 112 sequentially stacked on the second conductive layer pattern 108.

The first conductive layer pattern 104 and the second conductive layer pattern 108 may be formed of polysilicon layers. The inter-gate dielectric layer pattern 106 may be formed of an ONO layer and/or a high-k dielectric layer. With a high-k dielectric layer, the high-k dielectric layer may be formed of a single layer or a stack layer including at least one layer selected from the group consisting of an Aluminum oxide (AlO) layer, a Hafnium oxide (HfO) layer, a Hafnium silicate (HfSiO) layer, a Hafnium Aluminum oxide (HfAlO) layer, and/or a Tantalum oxide (TaO) layer. The metal layer pattern 110 may include a tungsten layer, and more particularly may include a stacked layer of a tungsten layer and a tungsten nitride layer. The capping layer pattern 112 may be formed of a silicon nitride layer. The first conductive layer pattern 104 may be provided as a floating gate electrode of the flash memory device, and the second conductive layer pattern 108 and the metal layer pattern 110 may be provided as a control gate electrode of the flash memory device.

Figure 2:
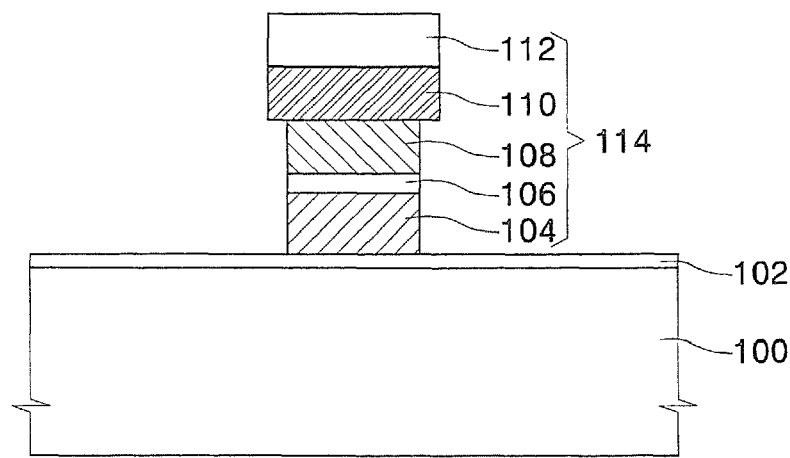

Referring to FIG. 2, after forming the gate structure 114, an undercut operation may be carried out to selectively etch sidewalls of the first conductive layer pattern 104, the inter-gate dielectric layer pattern 106 and the second conductive layer pattern 108 to reduce respective widths thereof. The undercut operation may be a wet etch using an etchant that selectively removes the first conductive layer pattern 104, the inter-gate dielectric layer pattern 106 and the second conductive layer pattern 108 relative to the metal layer pattern 110 and the capping layer pattern. For example, when the first and second conductive layer patterns 104 and 108 are formed of polysilicon layers and the inter-gate dielectric layer pattern 106 is formed of an ONO layer, a solution including hydrogen fluoride (HF) may be used as the etchant. As a result of the undercut operation, each of the first conductive layer pattern 104, the inter-gate dielectric layer pattern 106 and the second conductive layer pattern 108 may have a reduced width compared to the metal layer pattern 110 and the capping layer pattern 112 as shown in FIG. 2. Alternatively, the undercut operation may be optionally performed or skipped.

Figure 3:
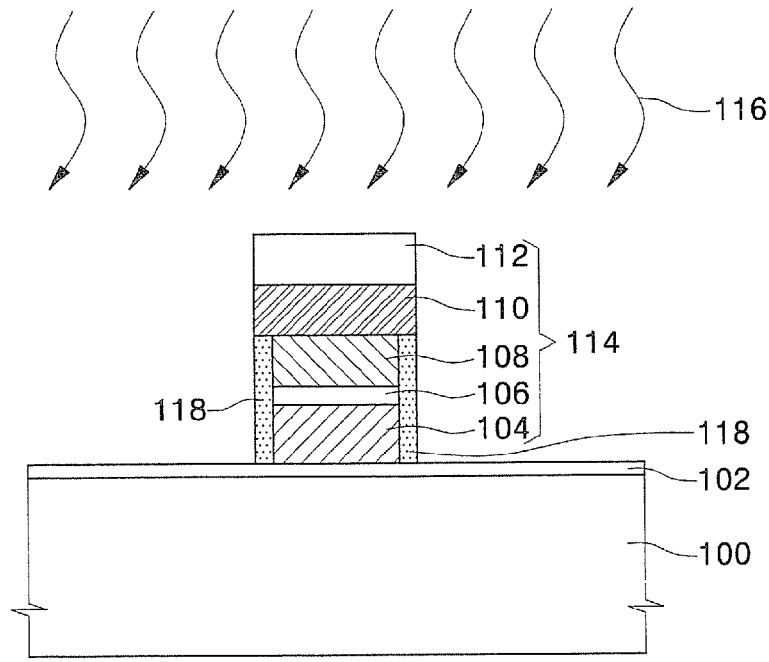

Referring to FIG. 3, a low temperature selective oxidation 116 may be performed on the gate structure 114 after the undercut operation is performed. The low temperature selective oxidation 116 may be an oxidation process that is performed at a temperature in the range of about 100° C. (degrees C.) to about 800° C. (degrees C.). In addition, the low temperature selective oxidation 116 may be a selective oxidation that does not form an oxide layer on an exposed sidewall of the metal layer pattern 110. In particular, when the metal layer pattern 110 includes the above-described tungsten layer, the low temperature selective oxidation may provide reduced oxidation of the exposed sidewall of the tungsten layer. Accordingly, the low temperature selective oxidation 116 may be a radical oxidation process using a hydrogen radical and/or an active oxygen radical in the plasma. As a result of the low temperature selective oxidation 116, a leakage barrier insulating layer 118 (a leakage barrier oxide) may be formed to cover sidewalls of the first and second conductive layer patterns 104 and 108. The leakage barrier insulating layer 118 may be a silicon oxide layer. In this case, the leakage barrier insulating layer 118 may be formed to a thickness in the range of about 5 Å (Angstroms) to about 100 Å (Angstroms) to reduce increases in the width of the gate structure 114. In addition, when the undercut operation is performed as described above, increases in the width of the gate structure 114 may be reduced because of the leakage barrier insulating layer 118 and a subsequent inter-insulating layer may thus be readily formed. The low temperature selective oxidation 116 may be performed at a temperature in the range of about 100° C. (degrees C.) to about 800° C. (degrees C.), so that an increase of the thickness of the inter-gate dielectric layer pattern 106 due to the bird's beak phenomenon may be reduced while the leakage barrier insulating layer 118 is formed.

More particularly, the low temperature selective oxidation 116 may include processing the structure of FIG. 2 including the gate structure 114 using plasma oxidation under an oxygen gas atmosphere including hydrogen $H_2$ and oxygen $O_2$. In this case, the plasma oxidation may be a radical oxidation process using a hydrogen radical and an oxygen radical included in the plasma. The plasma oxidation may use oxygen radicals dissociated in the plasma, so that the plasma oxidation can be carried out at lower temperatures than a conventional high temperature radical oxidation using an oxygen radical dissociated using heat. Accordingly, formation of a bird's beak at an edge of the tunnel oxide layer 102 can be reduced while the plasma oxidation is carried out.

Furthermore, according to the present invention, the oxide layer can be grown faster toward the polysilicon layer than the semiconductor substrate while the low temperature selective oxidation 116 is carried out, so that a lower edge of the first conductive layer pattern 104 can be formed to be rounded. As a result, concentration of the electric field can be alleviated on the lower edge of the first conductive layer pattern 104, which can prevent a leakage current via the tunnel oxide layer 102 from occurring.

The low temperature selective oxidation 116 may be carried out at a temperature in the range of about 100° C. (degrees C.) to about 800° C. (degrees C.). The low temperature selective oxidation 116 may be carried out, for example, at a temperature of about 600° C. or less. The reactor can be kept at a pressure in the range of about 1 mTorr to about 10 Torr while the low temperature selective oxidation 116 is carried out. The oxidation gas uses a hydrogen gas and an oxygen gas as its basic component and may further contain an inactive gas such as He, Ne, Ar, Kr, Xe, and Rn. In this case, a flow rate of the hydrogen gas flowing into the reactor may be in the range of about 20 sccm (standard cubic centimeter per minute) to about 2000 sccm, and a flow rate of the oxygen gas flowing into the reactor may be in the range of about 10 sccm to about 2000 sccm. Alternatively, a flow rate of the inactive gas may be in the range of about 10 sccm to about 2000 sccm when the inactive gas is further contained. In addition, plasma power used to carry out the low temperature selective oxidation 116 may be in the range of about 1400 W to about 3600 W.

Figure 4:
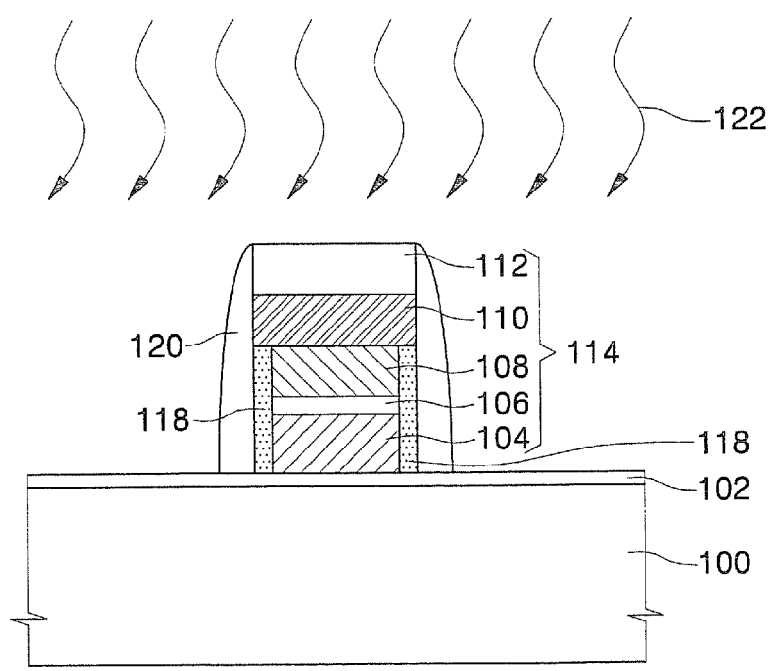

Referring to FIG. 4, a spacer insulating layer may be conformally formed on the semiconductor substrate 100 to cover the gate structure 114 including the leakage barrier insulating layer 118. The spacer insulating layer may be formed of a silicon nitride layer, and may be formed to a thickness in the range of about 10 Å (Angstroms) to about 100 Å (Angstroms). The spacer insulating layer may then be etched-back to form a spacer 120 covering sidewalls of the gate structure 114 including the leakage barrier insulating layer 118. The spacer 120 together with the gate structure 114 may provide a gate pattern of the flash memory device. The leakage barrier insulating layer 118 may reduce leakage currents between the second conductive layer pattern 108 provided as a control gate electrode and the first conductive layer pattern 104 provided as a floating gate electrode, along an interface between the spacer 120 and the gate structure 114. Subsequently, an additional oxidation 122 may be performed on the structure including the spacer 120. The additional oxidation 122 may be referred to as a gate reoxidation. The additional oxidation 122 may be performed to cure etch damage applied to the tunnel oxide layer 102 during formation of the spacer 120. The additional oxidation 122 may be performed with a larger process margin as compared with a process margin of the low temperature selective oxidation 116. That is, oxidation of the metal layer pattern 110 and bird's beak formation of the inter-gate dielectric layer pattern 106 may be reduced by the spacer 120. Accordingly, a dry oxidation using an oxygen gas, a wet oxidation performed in a thermal processing furnace in oxygen and vapor atmospheres, and/or a radical process using plasma may be applied without significant limits. More particularly, the additional oxidation 122 may be a radical oxidation process such as the low temperature selective oxidation 116 performed at a temperature in the range of about 100° C. to about 800° C. to reduce excessive bird's beak formation at a side portion of the tunnel oxide layer 102. Moreover, source/drain regions may be provided at surface portions of the substrate 100 on opposite sides of the first conductive layer pattern 104, and a channel region may be provided between the source/drain regions.

Figure 5:
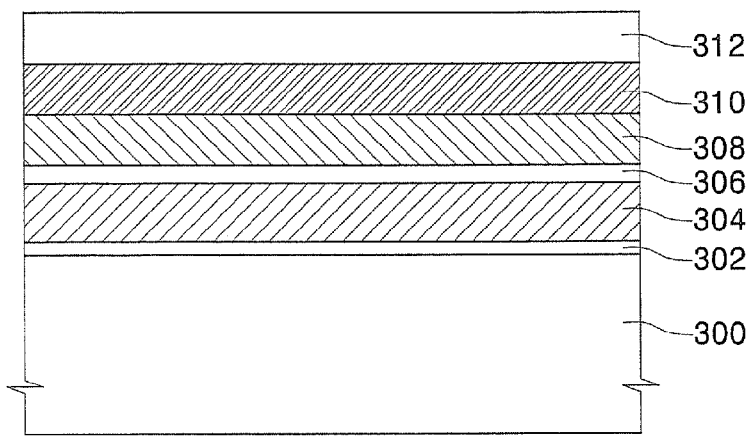
FIGS. 5 to 10 are cross-sectional views illustrating steps of forming gate patterns of flash memory devices according to second embodiments of the present invention.

FIGS. 5 to 10 are cross-sectional views illustrating a method of forming a gate pattern of a flash memory device according to other embodiments of the present invention. Referring to FIG. 5, a tunnel oxide layer 302 may be formed on a semiconductor substrate 300. The tunnel oxide layer 302 may be a thermal oxide layer. The tunnel oxide layer 302 may be formed to cover an active region defined by an isolation layer as discussed with respect to FIG. 1. A first conductive layer line 304 may be formed on the semiconductor substrate including the tunnel oxide layer 302. The first conductive layer line 304 may be formed by forming a polysilicon layer on the tunnel oxide layer 302 and performing photolithography and etching operations to pattern the polysilicon layer. More particularly, the first conductive layer line 304 may be formed to have a line shape on the active region. Subsequently, an inter-gate dielectric layer 306, a second conductive layer 308, a metal layer 310 and a capping layer 312 may be sequentially formed on the semiconductor substrate 300 including the first conductive layer line 304. The inter-gate dielectric layer 306 may be formed of an ONO layer and/or a high-k dielectric layer. With a high-k dielectric layer, the high-k dielectric layer may be formed of a single layer or a stack layer including at least one layer selected from the group consisting of an Aluminum oxide (AlO) layer, a Hafnium oxide (HfO) layer, a Hafnium silicate (HfSiO) layer, a Hafnium Aluminum oxide (HfAlO) layer, and/or a Tantalum oxide (TaO) layer. The second conductive layer 308 may be formed of a polysilicon layer. In addition, the metal layer 310 may be formed of a stacked layer of a tungsten nitride layer and a tungsten layer. The capping layer 312 may be formed of a silicon nitride layer.

Figure 6:
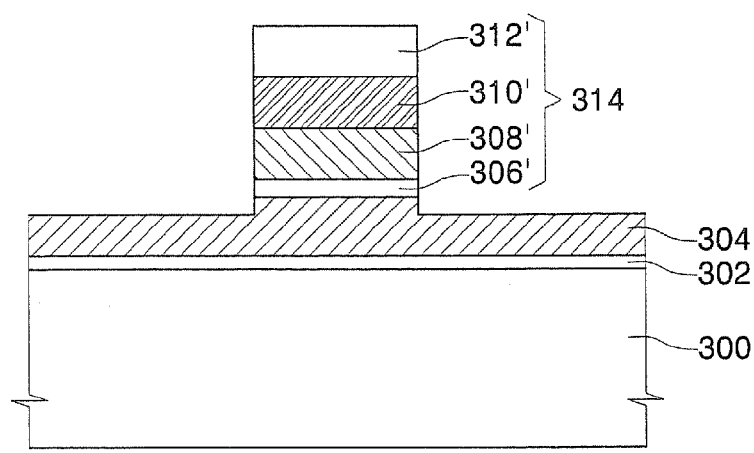

Referring to FIG. 6, photolithography and etching may be performed to pattern the capping layer 312, the metal layer 310, the second conductive layer 308, and the inter-gate dielectric layer 306 to expose portions of the first conductive layer line 304. A preliminary gate structure 314 including an inter-gate insulating layer pattern 306' (inter-gate dielectric), a second conductive layer pattern 308' (a second gate electrode), a metal layer pattern 310', and a capping layer pattern 312' may thus be formed. The preliminary gate structure 314 may be formed to cross the first conductive layer line 304 positioned between the preliminary gate structure and the substrate 300. In addition, an exposed upper portion of the first conductive layer line 304 may be etched to reduce a thickness thereof as shown in FIG. 6.

Figure 7:
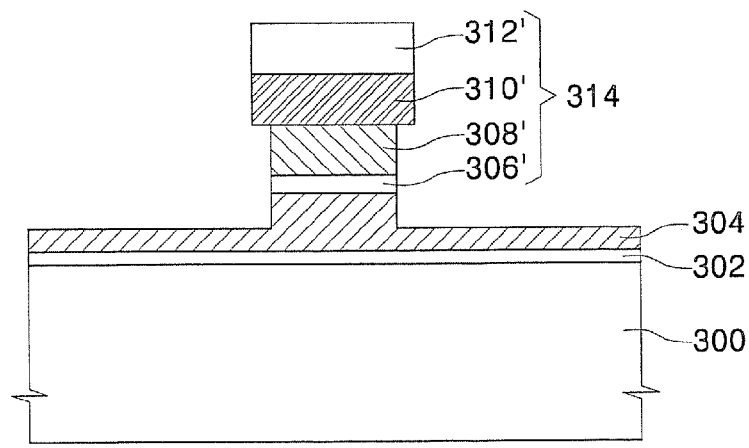

Referring to FIG. 7, an undercut operation may be performed to selectively etch sidewalls of the second conductive layer pattern 308, the inter-gate dielectric layer pattern 306, and an exposed region of the first conductive layer line 304 to reduce respective widths thereof. Upper portions of the first conductive layer line 304 may be etched so that the first conductive layer line 304 has a further reduced thickness. Alternatively, the undercut operation may be optionally performed and/or skipped.

Figure 8:
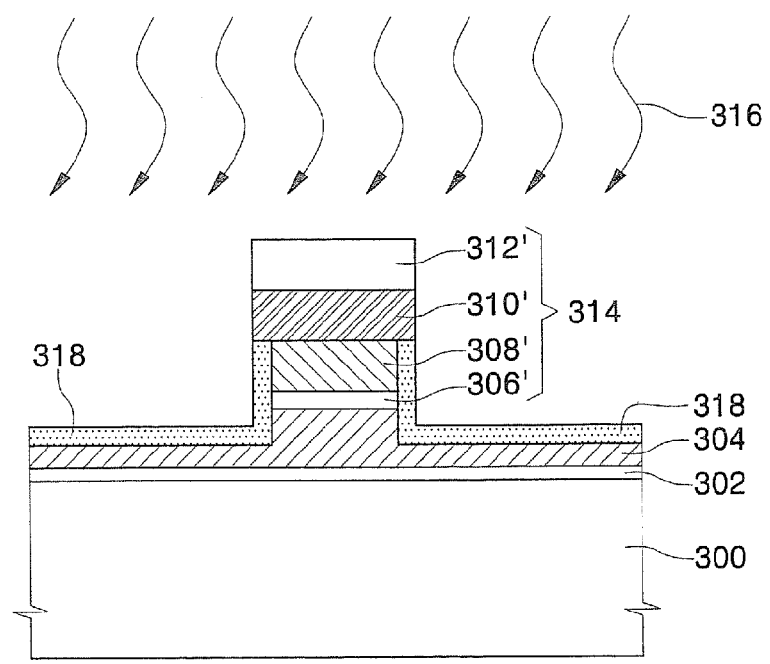

Referring to FIG. 8, after the undercut operation is performed, a low temperature selective oxidation 316 may be performed on the structure including the gate structure 314. The low temperature selective oxidation 316 may be a radical oxidation performed at a temperature in the range of about 100° C. to about 800° C. The low temperature selective oxidation 316 may provide a leakage barrier insulating layer 318 (leakage barrier oxide) covering exposed regions of the first conductive layer line 304 and sidewalls of the second conductive layer pattern 308'. The leakage barrier insulating layer 318 may be formed to a thickness in the range of about 5 Å (Angstroms) to about 100 Å (Angstroms). Further description of the low temperature selective oxidation 316 is provided above with reference to the low temperature oxidation 116 of FIG. 3.

Figure 9:
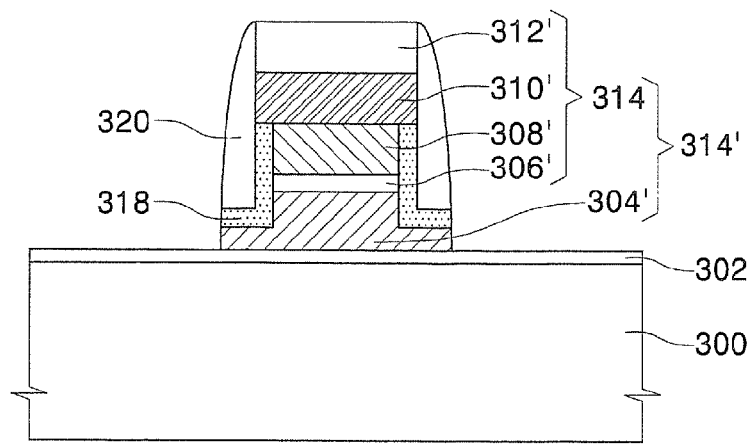

Referring to FIG. 9, a silicon nitride layer may be conformally formed to cover the structure including the leakage barrier insulating layer 318. The silicon nitride layer may be formed to a thickness in the range of about 10 Å (Angstroms) to about 100 Å (Angstroms). Subsequently, the silicon nitride layer may be etch-backed to form a spacer 320 covering sidewalls of the preliminary gate structure 314 including the leakage barrier insulating layer 318. The leakage barrier insulating layer 318 and the first conductive layer line (304 of FIG. 8) may then be anisotropically etched using the capping layer pattern 312' and the spacer 320 as etch masks. As a result, a first conductive layer pattern 304' (first gate electrode) may be aligned with respect to the spacer 320 and the preliminary gate structure 314 may be formed. The first conductive layer pattern 304' together with the preliminary gate structure 314 provides a gate structure 314'.

Figure 10:
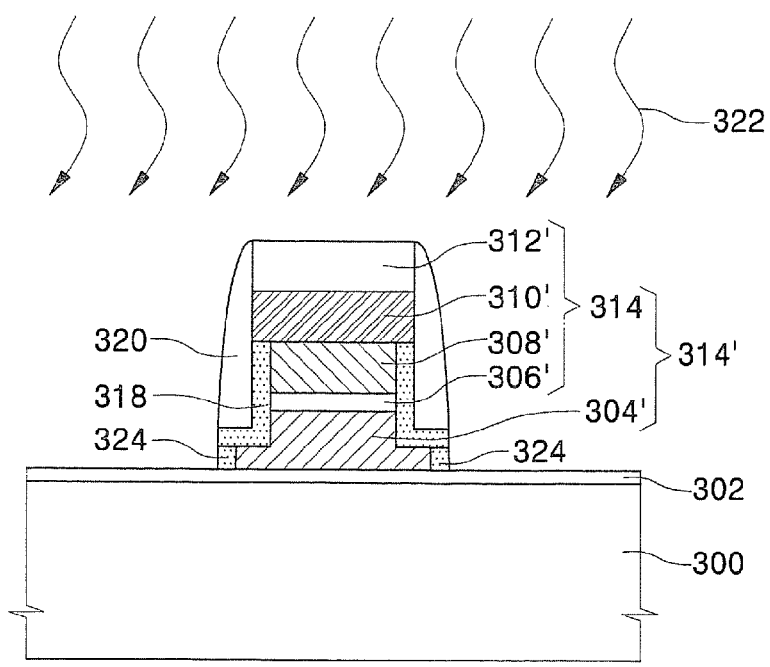

Referring to FIG. 10, an additional oxidation process 322 may be performed on the structure including the spacer 320. The additional oxidation 322 may be referred to as a gate reoxidation. The additional oxidation 322 may be performed to cure etch damage applied to the tunnel oxide layer 302 during an anisotropic etch process used to form the first conductive layer pattern 304'. As a result, a sidewall oxide layer 324 may be formed covering exposed sidewalls of the first conductive layer pattern 304'. The sidewall oxide layer 324 may be a silicon oxide layer. The additional oxidation 322 may be a radical oxidation such as the low temperature selective oxidation 316 performed at a temperature in the range of about 100° C. to about 800° C. to reduce excessive bird's beak formation at a side of the tunnel oxide layer 302. Although not shown, an additional spacer may be formed covering the spacer 320 and the sidewall oxide layer 324. For example, the additional spacer may be formed from a silicon nitride layer. Moreover, source/drain regions may be provided at surface portions of the substrate on opposite sides of the first conductive layer pattern 304, and a channel region may be provided between the source/drain regions.

Hereinafter, results of experiments forming the oxide layer using low temperature selective oxidation according to embodiments of the present invention will be described.

FIRST EXAMPLE

Table 1 shows results of experiments forming the oxide layer based on changes in condition of the low temperature selective oxidation.

Thicknesses of the oxide layer on the polysilicon layer and the silicon substrate were measured based on the oxidation gas at the time of carrying out the low temperature selective oxidation according to embodiments of the present invention, and experimental conditions and results are shown in Table 1. Same process conditions were used except for the oxidation gas shown in Table 1 at the time of carrying out the low temperature selective oxidation. In this case, the temperature and pressure of the reactor at the time of carrying out the low temperature selective oxidation were kept at about 500° C. and about 50 mTorr. In addition, a plasma power of about 3400 W was supplied thereto. Referring to Table 1, a thickness ratio represents a ratio of a thickness of the oxide layer formed on the silicon substrate and a thickness of the oxide layer formed on the polysilicon layer when the flow rate of the oxidation gases is in the same condition.

TABLE 1

| Sample | Condition of low temperature selective oxidation (flow rate of oxidation gas) | Underlying layer | Thickness of oxide layer(Å) | Thickness ratio |
|---|---|---|---|---|
| First sample | Ar/$H_2$/$O_2$(1000 sccm/200 sccm/100 sccm) | Silicon substrate | 57.6 | 1.32 |
| Second sample | | Polysilicon layer | 76.5 | |
| Third sample | $H_2$/$O_2$(320 sccm/40 sccm) | Silicon substrate | 60 | 1.44 |
| Fourth sample | | Polysilicon layer | 86.5 | |
| Fifth sample | He/$H_2$/$O_2$(100 sccm/160 sccm/20 sccm) | Silicon substrate | 60 | 1.40 |
| Sixth sample | | Polysilicon layer | 84.0 | |
| Seventh sample | Ar/$H_2$/$O_2$(500 sccm/400 sccm/100 sccm) | Silicon substrate | 60.1 | 1.44 |
| Eighth sample | | Polysilicon layer | 86.8 | |

Referring to Table 1, the thickness ratio was 1.32 when Ar, $H_2$, and $O_2$ were used for the oxidation gas of the first and second samples. Alternatively, the thickness ratio was 1.44 when Ar was omitted and only $H_2$ and $O_2$ were used for the oxidation gas of the third and fourth samples. The thickness ratio was 1.40 when Ar was replaced by He and only He, $H_2$, and $O_2$ were used for the oxidation gas of the fifth and sixth samples. In addition, the thickness ratio was 1.44 when Ar was used and the flow rate of Ar was decreased and the flow rate of $H_2$ was increased for the oxidation gas of the seventh and eight samples. Such results show that the oxide layer can be grown faster toward the polysilicon layer than the silicon substrate when only $H_2$ and $O_2$ are used for the oxidation gas at the time of carrying out the low temperature selective oxidation according to embodiments of the present invention. In addition, it can be seen that even when He and Ar are used as inactive gases in the oxidation gas, the same effect as the case of using only $H_2$ and $O_2$ can be obtained by adjusting the flow rate of the oxidation gas and other process conditions.

SECOND EXAMPLE

Table 2 shows results of an experiment forming the gate structure with low temperature selective oxidation according to embodiments of the present invention compared to the conventional high temperature oxidation.

TABLE 2

| | Thickness of gate oxide layer (Å) | |
|---|---|---|
| Sample | Average thickness of central region | Average thickness of edge region |
| A | 64 | 70 |
| B | 61 | 63 |
| C | 61 | 64 |
| D | 61 | 62 |

Sample A is a gate structure formed using a conventional high temperature oxidation process. In particular, a gate oxide layer was formed on a silicon substrate. The gate oxide layer was formed to a thickness of about 61 Å (Angstroms) using a thermal oxidation process. A polysilicon layer was then formed on the gate oxide layer, and the polysilicon layer was patterned to form a gate structure having a width of about 650 Å (Angstroms). The silicon substrate having the gate structure was then put into a furnace, and a low temperature oxidation process was carried out at a temperature of about 850° C. (degrees C.) in a steam and oxygen atmosphere.

All of the samples B, C, and D are gate structures formed by low temperature selective oxidation according to embodiments of the present invention. More particularly, a gate oxide layer and a polysilicon gate structure were formed on the silicon substrate as discussed above with respect to sample A, which were formed by low temperature selective oxidation according to embodiments of the present invention. Temperature and pressure at the time of carrying out the low temperature selective oxidation were kept at about 500° C. and about 50 mTorr. In addition, plasma power of about 3400 W was supplied thereto. The sample B was supplied into the reactor with Ar, $H_2$, and $O_2$ having a flow rate of about 1000 sccm, about 200 sccm, and about 100 sccm, respectively, as the oxidation gases of the low temperature selective oxidation. The sample C was supplied into the reactor with $H_2$ and $O_2$ having a flow rate of about 320 sccm and about 40 sccm, respectively, as the oxidation gases of the low temperature selective oxidation. The sample D was supplied into the reactor with He, $H_2$, and $O_2$ having a flow rate of about 100 sccm, about 160 sccm, and about 20 sccm, respectively, as the oxidation gases of the low temperature selective oxidation.

Referring to Table 2, it can be seen from the sample A that the thickness increased by about 3 Å (Angstroms) in the central region and by about 9 Å (Angstroms) in the edge region compared to the thickness 61 Å (Angstroms) of the gate oxide layer which was first prepared. That is, when the gate structure was formed by the conventional high temperature oxidation process, it was found that the thickness of the gate oxide layer increased by about 3 Å (Angstroms) in the central region and increased by about 9 Å (Angstroms) in its edge region in the gate structure. In addition, it was shown that the bird's beak encroachment formed below the gate structure was about 20 nm.

Alternatively, in the case of the samples B, C, and D, it can be seen that each initial thickness was kept as it is in the respective central region and increased by about 1 Å (Angstroms) to about 3 Å (Angstroms) in the edge region compared to the thickness of about 61 Å (Angstroms) of the gate oxide layer which was first prepared. That is, when the gate structure was formed by low temperature selective oxidation according to embodiments of the present invention, it was shown that the initial thickness of the gate oxide layer was kept as it is in the central region and increased by about 1 Å (Angstroms) to about 3 Å (Angstroms) in the edge region. In addition, it was shown that the bird's beak encroachment formed below the gate structure was about 5 nm or less in the case of the sample B. It was shown that the bird's beak encroachment was hardly found in the cases of the samples C and D. Such a result shows that an excessive increase in thickness of the gate oxide layer may be suppressed when the gate structure is formed by low temperature selective oxidation according to embodiments of the present invention.

In the meantime, in the case of the sample C, a radius of curvature of the lower edge of the gate structure was about 2.4 nm. That is, when $H_2$ and $O_2$ were used as the oxidation gas, the radius of curvature of the lower edge of the gate structure was about 2.4 nm. In addition, in the case of the sample D, a radius of curvature of the lower edge of the gate structure was about 1.4 nm. That is, when He, $H_2$ and $O_2$ were used as the oxidation gas, the radius of curvature of the lower edge of the gate structure was about 1.4 nm. Such results show that the lower edge of the gate structure can be relatively gently rounded when the low temperature selective oxidation is carried out in a condition capable of growing the oxide layer faster toward the polysilicon layer than the silicon substrate as is described in the first example. The gate structure having a gently rounded lower edge may reduce leakage current.

Furthermore, results of other experiments conducted by the present inventors showed that a lower edge of the gate structure may be gently rounded as the flow rate of the inactive gas and the flow rate of $H_2$ decreases and the flow rate of $O_2$ increases at the time of carrying out the low temperature selective oxidation.

According to embodiments of the present invention discussed above, a leakage barrier insulating layer may be formed covering sidewalls of the polysilicon gates using low temperature selective oxidation. A spacer may then be formed followed by a gate reoxidation so that increases in thickness of the inter-gate dielectric layer due to the bird's beak phenomenon may be reduced. In addition, a leakage barrier insulating layer may be formed between the spacer and the polysilicon gates so that leakage currents flowing through interfaces between the spacer and the polysilicon gates may be reduced. Furthermore, a leakage barrier insulating layer and a spacer sequentially covering sidewalls of a gate structure may be formed and a gate reoxidation process may then be performed, so that a process margin of the gate reoxidation may be improved.

While the present invention has been particularly shown and described with reference to embodiments thereof, it will be understood by those skilled in the art that various changes in form and details may be made therein without departing from the spirit and scope of the invention as defined by the appended claims and their equivalents.

What is claimed is:

1. A semiconductor device comprising:
   a semiconductor substrate;
   a tunnel oxide layer on the semiconductor substrate;
   a gate structure on the tunnel oxide layer such that the tunnel oxide layer is between the gate structure and the substrate, wherein the gate structure includes a first gate electrode on the tunnel oxide layer, an inter-gate dielectric on the first gate electrode, and a second gate electrode on the inter-gate dielectric, wherein the inter-gate dielectric is between the first and second gate electrodes;
   a leakage barrier oxide on sidewalls of the second gate electrode, wherein a surface of the gate structure opposite the semiconductor substrate is free of the leakage barrier oxide; and
   an insulating spacer on the leakage barrier oxide, wherein the leakage barrier oxide is between the insulating spacer and the sidewalls of the second gate electrode, and wherein the insulating spacer and the leakage barrier oxide comprise different materials.

2. A semiconductor device according to claim 1 wherein the leakage barrier oxide is on sidewalls of the first and second gate electrodes.

3. A semiconductor device according to claim 1 wherein the first and second gate electrodes comprise first and second polysilicon gate electrodes.

4. A semiconductor device according to claim 1 wherein the gate structure further comprises a metal layer on the second gate electrode, wherein the second gate electrode is between the metal layer and the gate dielectric, and wherein the metal layer and the second gate electrode comprise different materials.

5. A semiconductor device according to claim 4 wherein widths of the first and second gate electrodes and the inter-gate dielectric are less than a width of the metal layer.

6. A semiconductor device according to claim 5 wherein a combined width of the second gate electrode and the leakage barrier oxide thereon is approximately equal to a width of the metal layer.

7. A semiconductor device according to claim 5 wherein the metal layer comprises a tungsten layer.

8. A semiconductor device according to claim 1 wherein the inter-gate dielectric comprises an oxide/nitride/oxide (ONO) layer and/or a high-k dielectric layer.

9. A semiconductor device according to claim 1 wherein the inter-gate dielectric includes at least one layer selected from the group consisting of an Aluminum oxide (AlO) layer, a Hafnium oxide (HfO) layer, a Hafnium Aluminum oxide (HfAlO) layer, and/or a Tantalum oxide (TaO) layer.

10. A semiconductor device according to claim 1 wherein the leakage barrier oxide has a thickness in the range of about 5 Å (Angstroms) to about 100 Å (Angstroms).

11. A semiconductor device according to claim 1 wherein the insulating spacer comprises a silicon nitride spacer.

12. A semiconductor device according to claim 1 wherein the first gate electrode includes a relatively wide portion between the insulating spacer and the substrate and a relatively narrow portion on the relatively narrow portion.

13. A semiconductor device according to claim 12 further comprising:
 a sidewall oxide on edges of the relatively wide portion of the first gate electrode between the insulating spacer and the substrate.

14. A semiconductor device comprising:
 a tunnel oxide layer on a semiconductor substrate; and
 a gate structure on the tunnel oxide layer such that the tunnel oxide layer is between the gate structure and the substrate, wherein the gate structure includes a first gate electrode on the tunnel oxide layer, an inter-gate dielectric on the first gate electrode, a second gate electrode on the inter-gate dielectric, and a metal layer on the second gate electrode, wherein the inter-gate dielectric is between the first and second gate electrodes, wherein the second gate electrode is between the metal layer and the inter-gate dielectric, and wherein the metal layer and the second gate electrode comprise different materials; and wherein widths of the first and second gate electrodes and the inter-dielectric are less than a width of the metal layer.

15. A semiconductor device according to claim 14 further comprising:
 a leakage barrier oxide on sidewalls of the second gate electrode; and
 an insulating spacer on the leakage barrier oxide, wherein the leakage barrier oxide is between the insulating spacer and the sidewalls of the second gate electrode, and wherein the insulating spacer and the leakage barrier oxide comprise different materials.

* * * * *